United States Patent [19]

Ilardi et al.

[11] Patent Number: 5,466,389
[45] Date of Patent: Nov. 14, 1995

[54] PH ADJUSTED NONIONIC SURFACTANT-CONTAINING ALKALINE CLEANER COMPOSITION FOR CLEANING MICROELECTRONICS SUBSTRATES

[75] Inventors: Joseph M. Ilardi, Sparta; George Schwartzkopf, Franklin Township, both of N.J.; Gary G. Dailey, Easton, Pa.

[73] Assignee: J. T. Baker Inc., Phillipsburg, N.J.

[21] Appl. No.: 230,132

[22] Filed: Apr. 20, 1994

[51] Int. Cl.$^6$ .................... C11D 7/06; C11D 7/08; C11D 1/66; C23G 1/14
[52] U.S. Cl. .................... 252/156; 252/102; 252/173; 252/174.21; 134/2; 134/42
[58] Field of Search .................... 252/156, 79.1, 252/79.3, 81, 102, 173, 174.2, 186.1, 142; 134/2, 38, 40, 42

[56] References Cited

U.S. PATENT DOCUMENTS

| | | | |
|---|---|---|---|
| 4,039,371 | 8/1977 | Brunner et al. | 156/668 |
| 4,113,551 | 9/1978 | Bassous et al. | 156/662 |
| 4,239,661 | 12/1980 | Muraoka et al. | 252/541 |
| 4,339,340 | 7/1982 | Muraoka et al. | 252/79.5 |
| 4,710,449 | 12/1987 | Lewis et al. | 430/326 |
| 4,784,937 | 11/1988 | Tanaka et al. | 430/331 |
| 4,833,067 | 5/1989 | Tanaka et al. | 430/331 |
| 4,964,919 | 10/1990 | Payne | 134/2 |
| 5,185,235 | 2/1993 | Sato et al. | 430/331 |
| 5,207,866 | 5/1993 | Lue et al. | 156/647 |
| 5,259,888 | 11/1993 | McCoy | 134/2 |

FOREIGN PATENT DOCUMENTS

| | | | |
|---|---|---|---|
| 0496605 | 7/1992 | European Pat. Off. | C11D 7/06 |
| 0540261 | 5/1993 | European Pat. Off. | H01L 21/90 |
| 0578507 | 1/1994 | European Pat. Off. | G03F 7/42 |
| 63-114132 | 5/1988 | Japan | H01L 21/306 |
| 64-014924 | 1/1989 | Japan | H01L 21/304 |
| 3-93229 | 4/1991 | Japan | H01L 21/304 |
| 5-259066 | 10/1993 | Japan | H01L 21/027 |

OTHER PUBLICATIONS

J. M. Grant et al. "Characterization of rapid thermally grown dielectrics by surface charge analysis and atomic force microscopy", SPIE vol. 2091, pp. 51–62 (1993).

J. J. Kim et al., "Cleaning Process for Removing of Oxide Etch Residue" Electrochemical Society Proceedings, vol. 92-21, pp. 408–415 (1992).

S. D. Hossain et al. "Heated Sci Solution for Selective Etching and Resist Particulate Removal" J. Electrochem. Soc. Vol. 140, No. 12, pp. 3604–3606, Dec. 1993.

W. Kern, "Cleaning Solutions Based on Hydrogen Peroxide for Use in Silicon Semiconductor Technology" RCA Review, pp. 187–206, Jun. 1970.

W. Kern, "Radiochemical Study of Semiconductor Surface Contamination" RCA Review, pp. 207–233, Jun. 1970.

*Primary Examiner*—Paul Lieberman
*Assistant Examiner*—Lorna M. Douyon
*Attorney, Agent, or Firm*—Parmelee, Bollinger & Bramblett; George W. Rauchfuss, Jr.

[57] ABSTRACT

Aqueous alkaline cleaning solutions for cleaning microelectronic substrates and maintaining substrate surface smoothness comprise a metal ion free base, a nonionic surfactant and a component to reduce or control the pH of the cleaning solution to a pH within the range of from about pH 8 to about pH 10.

38 Claims, No Drawings

PH ADJUSTED NONIONIC SURFACTANT-CONTAINING ALKALINE CLEANER COMPOSITION FOR CLEANING MICROELECTRONICS SUBSTRATES

FIELD OF THE INVENTION

This invention relates to cleaners for use in the microelectronics industry for cleaning integrated circuit substrates, more particularly for cleaning wafers and vias, without producing undue etching of wafer surfaces.

BACKGROUND OF THE INVENTION

The cleaning of integrated circuit (IC) substrates, such as silicon wafers, with metal-free alkaline solutions to remove organic and metal contamination is widely practiced. One commonly used alkaline solution of this type is known as SC-1 or RCA-1 and comprises an aqueous mixture of ammonium hydroxide, hydrogen peroxide, and water (1:1:5 of 30% $H_2O_2$, 28% $NH_4OH$ and $H_2O$). Various cleaning tasks can be accomplished with SC-1, among these, the cleaning of silicon wafers immediately after their fabrication, the cleaning of such wafers immediately prior to gate oxide growth, the removal of oxide etch residues later in the IC processing sequence, and selective etching and resist particulate removal. The purpose of the hydrogen peroxide is to protect the silicon metal from exposure to strong acids or bases by continuously forming a protective oxide layer in order to prevent etching or roughening of the silicon surface.

However, the presence of hydrogen peroxide in SC-1 formulations imparts an inherent instability to these solutions. Such solutions typically exhibit peroxide half-lives of less than one hour at 70° C. The hydrogen peroxide in the SC-1 solution in the presence of certain metals, particularly copper and iron, becomes unstable and decomposes in rapid exothermic fashion leading to potentially dangerous conditions. The hydrogen peroxide has a low tolerance for metal contamination. Additionally, the decomposed hydrogen peroxide drops the concentration of the hydrogen peroxide leading to the possibility of silicon etching producing wafers that are not acceptable for IC manufacture. Thus, the decomposed hydrogen peroxide needs to be replenished and this changes the solution composition thereby varying the cleaning properties of the solution. In addition, the inherently high pH of the hydrogen peroxide solution presents undesirable safety and environmental concerns.

Hydrogen peroxide-free IC substrate cleaning solutions comprising simple aqueous solutions of quaternary ammonium hydroxides have been reported in Japanese Patent Publication No. 63-114132 and in U.S. Pat. No. 5,259,888. Oxide etch residue removal with such solutions has also been disclosed in EP Patent Publication 540,261 and Japanese Patent Publication No. 05- 259066. However, as disclosed in U.S. Pat. Nos. 4,113,551, and 4,339,340, such solutions etch (poly)silicon and single crystal silicon wafers resulting in rough surfaces that may be unsuitable for further processing. During the later stages of IC wafer fabrication, the original polished silicon surface has been covered with various oxide and metal layers. However, the backside of the wafer remains exposed to process fluids and must be protected similarly to the initial polished silicon surface. This silicon etching and resulting surface damage may be prevented by including hydrogen peroxide in the alkaline cleaning formulation as disclosed in Japanese Patent Publication No. 3- 93229 and U.S. Pat. Nos. 4,239,661, and 4,339,340. Other agents that reportedly suppress silicon etching include hydrazine as disclosed in Japanese Patent Publication No. 64-14924 and a certain nonionic surfactant, polyoxyethylene nonylphenol, as disclosed in U.S. Pat. Nos. 4,239,661, and 4,339,340. However, polyoxyethylene nonylphenol has recently been implicated as an environmental estrogen mimic.

It is therefore desirable that an alkaline cleaner solution be available which does not require the presence of hydrogen peroxide, that is, a cleaner composition in which the addition of hydrogen peroxide or other oxidizing agents is optional. More particularly, it is an object of this invention to provide such an alkaline cleaner solution that does not require the presence of hydrogen peroxide or other oxidizing agent yet produces an effective wafer cleaning action without producing undue wafer roughness sufficient to render the wafers unacceptable for IC manufacturing and processing, particularly for high density IC manufacturing. A still further object of this invention is to provide such an effective cleaning solution that can be used to clean vias in processed wafers of resist and etching residue, i.e. residual ash and organic and inorganic contaminants. A still further object of this invention is to provide such alkaline cleaning compositions for cleaning wafers and producing a roughness of less than about 25 Angstroms as the average distance in the Z direction between wafer peak heights and valleys.

BRIEF SUMMARY OF THE INVENTION

Alkaline cleaner compositions of this invention are provided by alkaline compositions containing aqueous metal ion free bases, a nonionic surfactant and a sufficient amount of a component to control or reduce the pH of the resulting cleaning solutions to a pH within the range of from about pH 8 to about pH 10. It has been discovered that all three components are required to produce an alkaline cleaner composition having effective wafer cleaning action without producing undesirable wafer surface roughness. As the data in the following examples demonstrates, cleaner compositions containing only the base alone, or the base combined with only the nonionic surfactant, or the base combined with only the pH control component, are unable to produce alkaline cleaning compositions producing effective cleaning action as well as not producing undue wafer surface roughness, i.e. a Z-range roughness of less than 25 Angstroms. In further embodiments of this invention, the alkaline cleaning compositions may additionally contain metal chelating agents and/or oxidizing agents and the like.

DETAILED DESCRIPTION OF THE INVENTION

The alkaline cleaning compositions of this invention generally comprise an alkaline component in an amount of up to about 25% by weight, generally from about 0.1 to about 10% by weight, a nonionic surfactant in an amount of up to about 5% by weight, generally from about 0.01 to about 2% by weight, and a sufficient amount of a component to reduce or control the pH of the resulting cleaning solution to a pH within the range of from about pH 8 to about pH 10, generally said amount being within the range of from about 0.1 to about 10% and preferably from about 0.5 to 2% by weight of the total cleaner composition, the remaining balance of the cleaner composition being made up of water, preferably high purity deionized water.

Any suitable alkaline component may be used in the cleaner compositions of this invention. The alkaline components of these cleaners are preferably quaternary ammonium hydroxides, such as tetraalkyl ammonium hydroxides (including hydroxy- and alkoxy-containing alkyl groups generally of from 1 to 4 carbon atoms in the alkyl or alkoxy group). The most preferable of these alkaline materials are tetramethyl ammonium hydroxide and trimethyl-2-hydroxyethyl ammonium hydroxide (choline). Examples of other usable quaternary ammonium hydroxides include: trimethyl-3-hydroxypropyl ammonium hydroxide, trimethyl-3-hydroxybutyl ammonium hydroxide, trimethyl-4-hydroxybutyl ammonium hydroxide, triethyl-2-hydroxyethyl ammonium hydroxide, tripropyl-2-hydroxyethyl ammonium hydroxide, tributyl-2-hydroxyethyl ammonium hydroxide, dimethylethyl-2-hydroxyethyl ammonium hydroxide, dimethyldi(2-hydroxyethyl) ammonium hydroxide, monomethyltri(2-hydroxyethyl) ammonium hydroxide, tetraethyl ammonium hydroxide, tetrapropyl ammonium hydroxide, tetrabutyl ammonium hydroxide, monomethyltriethyl ammonium hydroxide, monomethyltripopyl ammonium hydroxide, monomethyltributyl ammonium hydroxide, monoethyltrimethyl ammonium hydroxide, monoethyltributyl ammonium hydroxide, dimethyldiethyl ammonium hydroxide, dimethyldibutyl ammonium hydroxide, and the like and mixtures thereof.

Other alkaline components are also operable including, for example, ammonium hydroxide, organic amines particularly alkanolamines such as 2-aminoethanol, 1-amino-2-propanol, 1-amino- 3-propanol, 2-(2-aminoethoxy)ethanol, 2-(2-aminoethylamino)ethanol, 2-(2-aminoethylamino)ethylamine and the like, and other strong organic bases such as guanidine. Alkaline solutions containing metal ions such as sodium or potassium may also be operative. Mixtures of these additional alkaline components, particularly ammonium hydroxide, with the aforementioned tetraalkyl ammonium hydroxides are also useful.

The alkaline cleaner compositions of this invention may contain any suitable nonionic surfactant. Among the various suitable nonionic surfactant useful in the cleaner compositions of this invention there may be mentioned, for example, low foaming nonionic surfactants such as alkynol surfactants, fluorinated surfactants such as fluorinated alkyl alkoxylates such as Fluorad FC-171, fluorinated alkylesters such as FC-430 and FC-431 and fluorinated polyoxyethylene alkanols such as Fluorad FC-170C, aliphatic acid esters of polyhydric alcohols, polyoxyethylene monoalkyl ethers, polyoxyethylene diols, siloxane type surfactants and alkylene glycol monoalkyl ethers such as butoxypropanol. Preferred for use as nonionic surfactants in the alkaline cleaning compositions of this invention are alkyne surfactants, especially 3,5-dimethylhexyne-3-ol (Surfynol-61), fluorinated alkyl polyoxyethylene ethanols, especially Fluorad FC-170C and alkylene glycol monoalkyl ethers, especially butoxypropanol. The nonionic surfactants help partially to suppress silicon etching and also decrease surface tension of the cleaning compositions resulting in improved wetting of the surface to be cleaned and thereby improving the cleaning action of the composition.

Any compound or mixture of compounds suitable for reducing the pH of the alkaline cleaner solutions of this invention, and which do not unduly adversely inhibit the cleaning action thereof or interfere with the resulting cleaned wafers, may be employed. As examples of such compounds there may be mentioned, for example, acids, bases and their salts acting as buffers, such as inorganic mineral acids and their salts, weak organic acids having a pKa of greater than 2 and their salts, ammonium salts, and buffer systems such as weak acids and their conjugate bases, for example, acetic acid and ammonium acetate. Preferred for use as such components are acetic acid, potassium biphthalate, mixtures of ammonium chloride and ammonium acetate, especially a 1:1 mixture of these two salts, and mixtures of acetic acid and ammonia and other amines.

The cleaning solutions of this invention can be used as is or formulated with additional components such as any suitable metal chelating agents to increase the capacity of the formulation to retain metals in solution. Typical examples of chelating agents for this purpose are the following organic acids and their salts: ethylenediaminetetraacetic acid (EDTA), butylenediaminetetraacetic acid, cyclohexane-1,2-diaminetetraacetic acid, diethylenetriaminepentaacetic acid, ethylenediaminetetrapropionic acid, (hydroxyethyl)ethylenediaminetriacetic acid (HEDTA) , methyliminodiacetic acid, propylenediaminetetraacetic acid, nitrolotriacetic acid (NTA), citric acid, tartaric acid, gluconic acid, saccharic acid, glyceric acid, oxalic acid, phthalic acid, maleic acid, mandelic acid, malonic acid, lactic acid, salicylic acid, catechol, 8-hydroxyquinoline, N,N,N',N'-ethylenediaminetetra (methylenephosphonic acid, and the like.

Also, the addition of oxidizing agents to these formulations is also beneficial if the removal of organic contamination is an important concern. Hydrogen peroxide and the like is commonly used for this purpose. Any suitable oxidizing agent may be employed, such as, for example, oxidizing anions, such as, for example, nitric acid and its salts and nitrate, persulfate, periodate, perbromate, perchlorate, iodate, bromate, and chlorate salts of ammonium.

The invention is illustrated, but not limited to the following examples. In the examples, the percentages are by weight unless specified otherwise.

EXAMPLE 1

Aqueous solutions of tetramethyl ammonium hydroxide (TMAH) comprising 0.1, 1.0, and 10% TMAH were prepared. Silicon wafer samples (<1,0,0> crystal face, polished on both sides) were placed in these solutions for 10 minutes at 90° C. After treatment, the "$R_z$ roughness" (defined as the average distance in the z direction between peak heights and valleys) was measured for each concentration. The pH of each solution was also recorded. These highly alkaline solutions severely damaged the silicon surfaces, as shown by the following results.

| TMAH Concentration % | $R_z$ (Angstroms) | pH |
| --- | --- | --- |
| 0.1 | 13,500 | 12.4 |
| 1.0 | 14,500 | 13.1 |
| 10 | 20,000 | 14.2 |

The formulations were repeated with the addition of sufficient amount of a 1:1 mixture of ammonium chloride and ammonium acetate to reduce the pH of the solutions to the indicated pH levels.

| TMAH Concentration % | $R_z$ (Angstroms) | pH |
| --- | --- | --- |
| 0.1 | 200 | 8.0 |
| 0.1 | 500 | 7.1 |
| 1.0 | 200 | 9.2 |
| 1.0 | 500 | 8.0 |
| 10 | 600 | 9.4 |

Some reduction in roughness was achieved by pH reduction in this way. However, the silicon surfaces were also too rough to be useful for further IC processing.

The formulations were repeated incorporating 0.01%, 0.1%, or 1.0% of the surfactant 3,5-dimethylhexyne-3-ol (Surfynol-61), in the aqueous solutions of TMAH but with no addition of components to reduce the pH of the solutions. Surfactant addition alone gave little improvement in surface roughness as shown by the following data.

| TMAH Concentration % | Surfactant Concentration % | $R_z$ (Angstroms) | pH |
|---|---|---|---|
| 0.1 | 0.01 | 10,100 | 12.1 |
| 0.1 | 0.1 | 4,000 | 12.0 |
| 0.1 | 1.0 | 450 | 12.1 |
| 1.0 | 0.01 | 15,000 | 12.9 |
| 1.0 | 0.1 | 30,000 | 13.0 |
| 1.0 | 1.0 | 4,000 | 13.2 |
| 10 | 1.0 | 7,600 | 14.2 |

Next, cleaner compositions were prepared comprising aqueous solutions of TMAH, Surfynol-61 surfactant and a sufficient amount of a 1:1 mixture of ammonium chloride and ammonium acetate to adjust the pH of the solutions to the indicated pH levels. The observed results were as follows.

| TMAH Concentration % | Surfactant Concentration % | $R_z$ (Angstroms) | pH |
|---|---|---|---|
| 0.1 | 0.01 | <25 | 9.0 |
| 0.1 | 0.1 | 30 | 8.0 |
| 0.1 | 1.0 | <25 | 8.0 |
| 1.0 | 0.01 | 40 | 9.3 |
| 1.0 | 0.1 | <25 | 6.4 |
| 1.0 | 0.1 | <25 | 9.2* |
| 1.0 | 1.0 | <25 | 9.4 |
| 10 | 1.0 | <25 | 8.1 |

*this run utilized potassium biphthalate for pH adjustment.

The silicon wafers resulting from this series of cleaner treatments, which combine the use of an alkaline component and a nonionic surfactant with effective pH control are of sufficiently low roughness to be suitable for typical integrated circuit manufacturing.

EXAMPLE 2

Alkaline cleaning solutions were evaluated for their ability to produce smooth silicon surfaces at a lower temperature, 70° C., using the same procedure as in Example 1. The observed results for aqueous TMAH solutions alone were as follows.

| TMAH Concentration % | $R_z$ (Angstroms) | pH |
|---|---|---|
| 0.1 | 5,800 | 12.0 |
| 1.0 | 9,500 | 13.1 |
| 10 | 6,000 | 14.2 |

These highly alkaline solutions severely damaged the silicon surfaces even at 70° C.

The formulations were repeated with the addition of a sufficient amount of a 1:1 mixture of ammonium chloride and ammonium acetate to reduce the pH of the solutions to the indicated pH levels. The results obtained were as follows.

| TMAH Concentration % | $R_z$ (Angstroms) | pH |
|---|---|---|
| 1.0 | 300 | 9.2 |
| 1.0 | 100 | 8.0 |
| 10 | 300 | 9.4 |

Some reduction in roughness was achieved by pH reduction in this way. However, the silicon surfaces again remained too rough for typical IC processing.

The formulations were repeated incorporating 0.01%, 0.1%, or 1.0% of 3,5-dimethylhexyne-3-ol. Surfactant addition alone gave little improvement in surface roughness, as shown by the following data.

| TMAH Concentration % | Surfactant Concentration % | $R_z$ (Angstroms) | pH |
|---|---|---|---|
| 0.1 | 0.01 | 5,000 | 12.1 |
| 0.1 | 0.1 | 700 | 12 |
| 0.1 | 1.0 | 75 | 12.1 |
| 1 | 0.1 | 12,500 | 13 |
| 1 | 1.0 | 1,200 | 13.2 |
| 10 | 1.0 | 4,000 | 14.2 |

Next, cleaner compositions were prepared comprising aqueous solutions of TMAH, Surfynol-61 surfactant and a sufficient amount of 1:1 mixture of ammonium chloride and ammonium acetate to adjust the pH of the solutions to the indicated pH levels. The observed results were as follows.

| TMAH Concentration % | Surfactant Concentration % | $R_z$ (Angstroms) | pH |
|---|---|---|---|
| 0.1 | 0.01 | <25 | 9.0 |
| 0.1 | 0.1 | <25 | 9.0 |
| 0.1 | 0.1 | <25 | 8.0 |
| 0.1 | 1.0 | <25 | 8.0 |
| 1.0 | 0.1 | 30 | 9.3 |
| 1.0 | 0.1 | <25 | 9.2* |
| 1.0 | 1.0 | <25 | 9.4 |
| 10 | 1.0 | <25 | 8.1 |

*this run utilized potassium biphthalate for pH adjustment.

The silicon wafers resulting from this series of cleaner treatments, which combine the use of an alkaline component and a nonionic surfactant with effective pH control are of sufficiently low roughness to be suitable for typical integrated circuit manufacturing.

EXAMPLE 3

Alkaline cleaning solutions were evaluated for their ability to produce smooth silicon surfaces at an additional lower temperature, 50° C., using the same procedure as in Example 1. The observed results for aqueous TMAH solutions alone were as follows.

| TMAH Concentration % | $R_z$ (Angstroms) | pH |
|---|---|---|
| 1.0 | 700 | 13.1 |
| 10 | 700 | 14.2 |

These highly alkaline solutions damaged the silicon surfaces even at 50° C.

The 1.0% TMAH concentration in the cleaner composition was repeated with the addition of a 1:1 mixture of ammonium chloride and ammonium acetate to reduce the pH of the solution to the indicated pH level.

| TMAH Concentration % | $R_z$ (Angstroms) | pH |
|---|---|---|
| 1 | 500 | 9.2 |

Some reduction in roughness was achieved by pH reduction in this way. However, the resulting silicon surface was too rough for typical IC processing.

These formulations were repeated incorporating 0.01%, 0.1%, or 1.0% of the surfactant 3,5-dimethylhexyne-3-ol (Surfynol-61) in the aqueous TMAH solution with no addition of components to reduce the pH level of the solutions. Surfactant addition alone gave little improvement in surface roughness, as shown by the following observed data.

| TMAH Concentration % | Surfactant Concentration % | $R_z$ (Angstroms) | pH |
|---|---|---|---|
| 1.0 | 0.1 | 2,500 | 13 |
| 1.0 | 1.0 | 150 | 13.2 |
| 10 | 1.0 | 1,600 | 14.2 |

Next, cleaner compositions were prepared comprising aqueous solutions of TMAH, Surfynol-61 surfactant and a sufficient amount of a 1:1 mixture of ammonium chloride and ammonium acetate to adjust the pH of the solutions to the indicated pH levels. The observed results were as follows.

| TMAH Concentration % | Surfactant Concentration % | $R_z$ (Angstroms) | pH |
|---|---|---|---|
| 1 | 0.1 | <25 | 9.3 |
| 1 | 0.1 | <25 | 9.2* |
| 1 | 1 | <25 | 9.4 |
| 10 | 1 | <25 | 8.1 |

*this run utilized potassium biphthalate for pH adjustment.

The silicon wafers resulting from this series of cleaner treatments, which combine the use of an alkaline component and a nonionic surfactant with effective pH control are of sufficiently low roughness to be suitable for typical integrated circuit manufacturing.

EXAMPLE 4

Examples 1–3 demonstrate the use of controlled pH alkaline mixtures containing the nonionic surfactant 3,5-dimethylhexyne-3-ol as cleaning solutions without damaging the surface of silicon wafers. This example illustrates the use of other nonionic surfactants.

Cleaner compositions of aqueous solutions of TMAH and the indicated surfactants, both without and then with the addition of acetic acid to adjust the pH of the solutions to the indicated pH levels, were prepared and tested on silicon wafer surfaces at 90° C. for 10 minutes as described in Example 1. The following data was observed.

| TMAH Concentration % | Surfactant Concentration % | $R_z$ (Angstroms) | pH |
|---|---|---|---|
| 1.0 | Surfynol-104E (.05) | 1,600 | 13.2 |
| 1.0 | Surfynol-104E (.05) | <25 | 9.4 |
| 1.0 | Surfynol-104E (0.1) | 500 | 13.3 |
| 1.0 | Surfynol-104E (0.1) | <25 | 9.4 |
| 1.0 | Surfynol-400 (0.1) | 250 | 13.3 |
| 1.0 | Surfynol-400 (0.1) | <25 | 9.5 |
| 1.0 | Fluorad FC-170C (0.1) | 950 | 13 |
| 1.0 | Fluorad FC-170C (0.1) | <25 | 7.9* |
| 1.0 | Flourad FC-431 (0.1) | 350 | 13.2 |
| 1.0 | Flourad FC-431 (0.1) | <25 | 9.3 |
| 1.0 | Silwet L-7604 (0.1) | 1,450 | 13.5 |
| 1.0 | Silwet L-7604 (0.1) | <25 | 9.2 |
| 1.0 | Silwet L-7607 (0.1) | 1,150 | 13.5 |
| 1.0 | Silwet L-7607 (0.1) | <25 | 9.3 |
| 0.5 | 1-butoxy-2-propanol (2.0) | 750 | 12.6 |
| 0.5 | 1-butoxy-2-propanol (2.0) | <25 | 9.2 |

*this example utilized a 1:1 mixture of ammonium chloride and ammonium acetate to adjust the pH of the aqueous solution.

Only when the pH had been adjusted to within the range of about pH 8.0 to 10.0 was the surface of the wafers of sufficiently low roughness to be suitable for typical integrated circuit manufacturing.

Similar cleaner compositions of aqueous solutions of TMAH, the indicated surfactants, both without and then with acetic acid to adjust the pH of the solutions to the indicated pH levels, were prepared and tested on silicon wafer surfaces at 70° C. for 10 minutes.

| TMAH Concentration % | Surfactant Concentration % | $R_z$ (Angstroms) | pH |
|---|---|---|---|
| 1.0 | Surfynol-104E (.05) | 250 | 13.2 |
| 1.0 | Surfynol-104E (.05) | <25 | 9.4 |
| 1.0 | Surfynol-104E (0.1) | 250 | 13.3 |
| 1.0 | Surfynol-104E (0.1) | <25 | 9.4 |
| 1.0 | Surfynol-440 (0.1) | 100 | 13.3 |
| 1.0 | Surfynol-440 (0.1) | <25 | 9.5 |
| 1.0 | Fluorad FC-170C (0.1) | 50 | 13 |
| 1.0 | Fluorad FC-170C (0.1) | <25 | 7.9* |
| 1.0 | Flourad FC-430 (0.1) | 250 | 13.3 |
| 1.0 | Flourad FC-430 (0.1) | <25 | 9.4 |
| 1.0 | Silwet L-7607 (0.1) | 650 | 13.5 |
| 1.0 | Silwet L-7607 (0.1) | <25 | 9.3 |
| 0.5 | 1-butoxy-2-propanol (2.0) | 50 | 12.6 |
| 0.5 | 1-butoxy-2-propanol (2.0) | <25 | 9.2 |

*this example utilized a 1:1 mixture of ammonium chloride and ammonium acetate to adjust the pH levels of the aqueous solutions.

Only when the pH had been adjusted to within the range of about pH 8.0 to 10.0 was the surface of the wafers of sufficiently low roughness to be suitable for typical integrated circuit manufacturing.

The chemical designations of the surfactants employed in this Example 4 are as follows.

| Trade Name | Chemical Description |
|---|---|
| Surfynol-104E | 2,4,7,9-tetramethyl-5-decyne-4,7-diol |
| Surfynol-440 | ethoxylated tetramethyldecyndiol |
| Fluorad FC-170C | fluorinated alkyl polyoxyethylene ethanols |
| Flourad FC-430 | fluorinated alkyl esters |
| Flourad FC-431 | fluorinated alkyl esters |
| Silwet L-7604 | organomodified polymethylsiloxane |
| Silwet L-7607 | polyalkyleneoxide modified polydimethylsiloxane |

EXAMPLE 5

Other metal-free aqueous alkaline base components may be utilized in the cleaner compositions of this invention in place of the aqueous TMAH used in the preceding examples. The following data was obtained similarly to Example 1 at 90° C. for 10 minutes with Surfynol-61 utilized as the surfactant and acetic acid utilized to adjust the pH of the aqueous solutions to within a pH range of from about pH 8.0 to about 10.0.

| Base Concentration % | Surfactant Concentration % | $R_z$ (Angstroms) | pH |
|---|---|---|---|
| tetraethylammonium hydroxide (1.0) | none | 22,000 | 13.1 |
| tetraethylammonium hydroxide (1.0) | 0.1 | 12,500 | 13.2 |
| tetraethylammonium hydroxide (1.0) | 0.1 | <25 | 9.2 |
| choline (1.0) | none | 6,200 | 12.9 |
| choline (1.0) | 0.1 | 1,100 | 13.1 |
| choline (1.0) | 0.1 | <25 | 9.2 |

The following data for cleaner compositions containing other alkaline base components was obtained similarly at 70° C. for 10 minutes.

| Base Concentration % | Surfactant Concentration % | $R_z$ (Angstroms) | pH |
|---|---|---|---|
| tetraethylammonium hydroxide (1.0) | none | 5,000 | 13.1 |
| tetraethylammonium hydroxide (1.0) | 0.1 | 3,300 | 13.2 |
| tetraethylammonium hydroxide (1.0) | 0.1 | <25 | 9.2 |
| choline (1.0) | none | 4,300 | 12.9 |
| choline (1.0) | 0.1 | 250 | 13.1 |
| choline (1.0) | 0.1 | <25 | 9.2 |
| 2-aminoethanol (2.0) | none | 16,000 | 11.9 |
| 2-aminoethanol (2.0) | 0.1 | 1,200 | 12.0 |
| 2-aminoethanol (2.0) | 0.1 | <25 | 9.2 |
| guanidine carbonate (2.0) | none | 6,400 | 11.5 |
| guanidine carbonate (2.0) | 0.1 | 500 | 11.5 |
| guanidine carbonate (2.0) | 0.1 | 50 | 9.2 |

The data also shows that the benefits of this invention are obtained with aqueous alkaline cleaner compositions containing a variety of alkaline base components.

EXAMPLE 6

A cleaner bath containing a preferred formulation of this invention was prepared by mixing: 7.6 L of wafer, 79 gm of tetramethylammonium hydroxide, 7.9 gm of EDTA, 150 gm of 1-butoxy- 2-propanol, and 150 gm of ammonium acetate. This cleaner bath was used to clean silicon wafers (a total of 12,560 $cm^2$ in area) at room temperature with the unpolished wafer backs exposed. The silicon wafers had been processed in the manner described hereinafter.

Silicon wafers were obtained that had been processed in the following manner:
  a. metallization with copper/aluminum alloy followed by titanium and then titanium nitride;
  b. coating with a silicon oxide dielectric using chemical vapor deposition;
  c. lithographic patterning of 0.5 to 1.0 microns vias using a photoresist material;
  d. pattern transfer to the dielectric layer using reactive ion etching;
  e. plasma ashing to remove most of the residual photoresist.

The resulting patterned wafers were contaminated with a considerable amount of residual ash that comprised a mixture of organic materials from the photoresist and inorganic materials from the underlying metal layer that had been partially exposed during step (d). The use of the hereinbefore described cleaner bath formulation as well as the following controlled pH alkaline cleaning solutions, all of which contained water, tetramethyl ammonium hydroxide, a nonionic surfactant (either 3,5-dimethylhexyne- 3-ol or 1-butoxy-2-propanol), and a chelating agent (EDTA) and one of the following listed pH reducing components, removed this residual ash without damaging any silicon or metal features that were present.

| pH Reducing Component | pH |
|---|---|
| Ammonium acetate | 9.3–10.0 |
| Ammonium acetate, ammonium hydroxide | 9–10 |
| Acetic acid, ammonium hydroxide | 9.5–10 |
| Acetic acid, 1-amino-2-propanol | 9.5–10 |
| Acetic acid, hydrogen peroxide | 9.3 |
| Ammonium acetate, hydrogen peroxide | 9.5 |
| Ammonium acetate, nitric acid | 9.5 |
| Ammonium nitrate | 8.9–10.0 |
| Ammonium chloride, ammonium acetate, hydrogen peroxide | 9.6–10.0 |
| Ammonium chloride, ammonium acetate, ammonium periodate | 9–10 |
| Ammonium chloride, ammonium acetate, ammonium nitrate | 9.4–10.0 |
| Ammonium chloride, ammonium acetate, ammonium persulfate | 9–10 |

Photoresist ash residues were successfully removed. The bath was analyzed for silicon content after use giving <0.2 ppm of dissolved Si demonstrating that the desired cleaning was achieved without etching exposed silicon or silicon dioxide circuit elements.

EXAMPLE 7

This example demonstrates the metal removal capabilities of a cleaner formulation for the removal of aluminum, copper, and iron from metal-contaminated silicon wafers. Cleaner Formulation A was prepared by dissolving ethylenediaminetetraacetic acid (EDTA), ammonium acetate, tetramethyl ammonium hydroxide, and 3,5-dimethylhexyne-3-ol in deionized water. Cleaner Formulation B was similarly prepared substituting nitrilotriacetic acid (NTA) for the EDTA. Both formulations exhibited a pH of approximately 10. Metal-contaminated wafers were cleaned in these solutions for 10 minutes at 70° C. The wafers were removed from the cleaner, rinsed in deionized water, and dried. The remaining amount of wafer metal contamination was measured by washing the wafers with dilute hydrochloric acid which was then analyzed for aluminum, copper, and iron. The observed results were as follows.

| Cleaning Formulation | Aluminum (micrograins/ wafer) | Copper (micrograms/ wafer) | Iron (micrograms/ wafers |
|---|---|---|---|
| none | 1 | 1 | 0.9 |
| Formulation A | 0.1 | <0.01 | 0.2 |
| Formulation B | 0.06 | <0.01 | 0.1 |

EXAMPLE 8

In another embodiment of the present invention an aqueous alkaline cleaner (Formulation C) containing tetramethyl ammonium hydroxide (0.5%), EDTA (0.1%), ammonium chloride (0.3%), ammonium acetate (0.3%), hydrogen peroxide (1.0%), and 3,5-dimethylhexyne- 3-ol (0.1%) was directly compared to a conventional SC-1 cleaner containing, by volume, one part concentrated ammonium hydroxide, one part 30% hydrogen peroxide, and five parts of deionized water. Both cleaning solutions were purposely contaminated with 5 micrograms/liter each of aluminum, iron, and nickel, and 10 micrograms/liter of copper introduced as nitrate salts. Silicon wafers were cleaned in these solutions for 10 minutes at 70° C. after which they were rinsed in deionized water, and dried. Residual metal contamination on the wafers was then measured using hydrogen fluoride vapor phase decomposition of the native oxide layer of the silicon wafer followed by scanning the wafer surface with a small volume of water. This water was removed and analyzed by inductively coupled plasma analysis with mass spectral detection giving the following results.

| Cleaning Formulation | × $10^{10}$ atoms/cm$^2$ | | | |
|---|---|---|---|---|
| | Aluminum | Copper | Nickel | Iron |
| none (untreated wafer) | 42 | <6 | 21 | 72 |
| SC-1 | 2,800 | <15 | 5 | 743 |
| Formulation C | 52 | <6 | <2 | 35 |

These data clearly show the superior cleaning ability of Formulation C versus that of a conventional cleaner for metal removal from silicon wafer surfaces.

EXAMPLE 9

Silicon wafers were cleaned as in Example 8 and an Atomic Force Microscope (AFM) was used to examine the surfaces for roughness before and after cleaning. Roughness is reported in this example as "mean roughness" ($R_a$) which is defined as the mean value of the surface relative to the center plane and is calculated using:

$$R_a = \frac{1}{L_y L_x} \int_1^{L_y} \int_1^{L_x} |f(x,y)| dx dy$$

where $ff(x,y)$ is the surface relative to the center plane and $L_x$ and $L_y$ are the dimensions of the surface in two dimensions.

The untreated, polished wafer with its normal covering of native oxide has an $R_a$ of 0.140 nanometers. When this surface is exposed to SC-1 the $R_a$ value increases to 0.185 nanometers. However, exposure to Formulation C beneficially lowers this $R_a$ value to 0,137 nanometers.

| Sample | $R_a$ (nanometers) |
|---|---|
| none (untreated wafer) | 0.140 |
| SC-1 | 0.185 |
| Formulation C | 0.137 |

EXAMPLE 10

Flamed 57 mm. quartz wafers were used which were stored in sealed quartz petri dishes to avoid organic contamination. These wafers were cleaned as in Example 8 and analyzed for organic contamination using plasma chromatography coupled with mass spectroscopy (PC/MS). This technique involves heating to volatilize any adhering organic materials. The volatilized molecules are ionized and separated into identifiable fractions by passing them through a potential gradient. The high sensitivity of PC/MS allows detection of one part of organic material in $10^{13}$ parts of matrix.

The untreated wafer was simply rinsed in deionized water for ten minutes at room temperature. The PC/MS spectrum for this untreated wafer had two ion mass peaks (293 and 337 mass units) which are due to the environmentally ubiquitous phthalate esters, common plasticizers used in laboratory equipment. A wafer cleaned as in Example 8 using SC-1, gave a PC/MS spectrum having six new ion mass peaks (300, 335, 371, 411, 436, 533 mass units) indicative of more organic contamination than the untreated control. A wafer cleaned as in Example 8 using a formulation containing TMAH (1%), EDTA (0.1%), ammonium chloride (0.3%), ammonium acetate (0.3%), hydrogen peroxide (7%) and 3,5-dimethylhexyne- 3-ol (0.2%), gave a PC/MS spectrum having three ion mass peaks (300, 337 and 372 mass units). This spectrum shows less organic contamination than that indicated for SC-1. Thus, this cleaner formulation of this invention reduces residual volatile organics on this wafer to less than the standard SC-1 treatment. This Example shows that negligible residue was left by the organic components of this formulation insuring that further IC processing can proceed without interference.

With the foregoing description of the invention, those skilled in the art will appreciate that modifications may be made to the invention without departing from the spirit thereof. Therefore, it is not intended that the scope of the invention be limited to the specific embodiments illustrated and described.

We claim:

1. An alkaline cleaning solution for microelectronics substrates comprising from about 0.1% to about 25% by weight of an aqueous, metal ion free, base, from about 0.1% to about 5% by weight of a nonionic surfactant and an effective amount of a pH reducing chemical buffering component to reduce and control the pH of the cleaning solution to a pH within the range of from about pH 8 to about pH 10, wherein said pH reducing chemical buffering component is selected from the group consisting of inorganic mineral acids and their salts, ammonium hydroxide and its salts, acetic acid and its salts, and mixtures thereof.

2. An alkaline cleaning solution according to claim 1 comprising from about 0.1% to about 10% by weight metal ion free base, from about 0.01% to about 2% by weight nonionic surfactant and from about 0.1 to about 10% by weight of the chemical component to reduce and control the pH of the cleaning solution.

3. An alkaline cleaning solution of claim 1 wherein the metal ion free base is selected from the group consisting of a tetraalkyl ammonium hydroxide wherein the alkyl group is an unsubstituted alkyl group or an alkyl group substituent with a hydroxy or alkoxy radical.

4. A cleaner solution of claim 3 wherein the metal ion free base is selected from the group consisting of tetramethyl ammonium hydroxide, tetraethyl ammonium hydroxide and trimethyl-2-hydroxyethyl ammonium hydroxide.

5. A cleaning solution of claim 4 wherein the metal ion free base is tetramethyl ammonium hydroxide.

6. A cleaning solution as claimed in claim 1 wherein the metal ion free base is an alkanolamine.

7. A cleaning solution as claimed in claim 1 wherein the metal ion free base is a guanidine compound.

8. A cleaning solution of claim 3 wherein the nonionic surfactant is selected from the group consisting of alkynol surfactants, fluorinated polyoxyethylene alkanol surfactants, siloxane surfactants and alkylene glycol monoalkyl ether surfactants.

9. A cleaning solution of claim 8 wherein the nonionic surfactant is selected from the group consisting of 3,5-dimethylhexyne-3-ol, a fluorinated polyoxyethylene ethanol and butoxypropanol.

10. A cleaning solution of claim 4 wherein the nonionic surfactant is selected from the group consisting of alkynol surfactants, fluorinated polyoxyethylene alkanol surfactants, siloxane surfactants and alkylene glycol monoalkyl ether surfactants.

11. A cleaning solution of claim 5 wherein the nonionic surfactant is selected from the group consisting of alkynol surfactants, fluorinated polyoxyethylene alkanol surfactants, siloxane surfactants and alkylene glycol monoalkyl ether surfactants.

12. A cleaning solution of claim 10 wherein the nonionic surfactant is selected from the group consisting of 3,5-dimethylhexyne-3-ol, a fluorinated polyoxyethylene ethanol and butoxypropanol.

13. A cleaning solution of claim 11 wherein the nonionic surfactant is selected from the group consisting of 3,5-dimethylhexyne-3-ol, a fluorinated polyoxyethylene ethanol and butoxypropanol.

14. A cleaning solution of claim 1 additionally comprising a metal chelating effective amount of metal chelating agent.

15. A cleaning solution of claim 4 additionally comprising a metal chelating effective amount of a metal chelating agent.

16. A cleaning solution of claim 9 additionally comprising a metal chelating effective amount of a metal chelating agent.

17. A cleaning solution of claim 12 additionally comprising a metal chelating effective amount of a metal chelating agent.

18. A cleaning solution of claim 17 wherein the metal chelating agent is ethylenediaminetetraacetic acid.

19. A cleaning solution of claim 1 additionally comprising an oxidizing effective amount of an oxidizing agent.

20. A cleaning solution of claim 19 wherein the oxidizing agent is selected from the group consisting of hydrogen peroxide, nitric acid and its salts, and the persulfate, periodate, perbromate, perchlorate, iodate, bromate or chlorate salts of ammonium.

21. A cleaning solution of claim 12 additionally comprising an oxidizing effective amount of an oxidizing agent selected from the group consisting of hydrogen peroxide, nitric acid and its salts, and the persulfate, periodate, perbromate, perchlorate, iodate, bromate or chlorate salts of ammonium.

22. A cleaning solution of claim 1 wherein the chemical component to reduce the pH of the cleaning solution is selected from the group consisting of acetic acid, potassium biphthalate, a mixture of ammonium acetate with ammonium chloride, and a mixture of acetic acid with ammonia.

23. A cleaning solution of claim 8 wherein the chemical component to reduce the pH of the cleaning solution is selected from the group consisting of acetic acid, potassium biphthalate, a mixture of ammonium acetate with ammonium chloride, and a mixture of acetic acid with ammonia.

24. A cleaning solution of claim 10 wherein the chemical component to reduce the pH of the cleaning solution is selected from the group consisting of acetic acid, potassium biphthalate, a mixture of ammonium acetate with ammonium chloride, and a mixture of acetic acid with ammonia.

25. A cleaning solution of claim 11 wherein the chemical component to reduce the pH of the cleaning solution is selected from the group consisting of acetic acid, potassium biphthalate, a mixture of ammonium acetate with ammonium chloride, and a mixture of acetic acid with ammonia.

26. A cleaning solution of claim 12 wherein the chemical component to reduce the pH of the cleaning solution is selected from the group consisting of acetic acid, potassium biphthalate, a mixture of ammonium acetate with ammonium chloride, and a mixture of acetic acid with ammonia.

27. A cleaning solution of claim 1 comprising water, tetramethyl ammonium hydroxide, 3,5-dimethylhexyne-3-ol, ammonium chloride and ammonium acetate.

28. A cleaning solution of claim 27 additionally comprising a metal chelating effective amount of ethylenediaminetetraacetic acid.

29. A cleaning solution of claim 1 comprising water, tetramethyl ammonium hydroxide, acetic acid, ammonia or an alkanolamine and 1-butoxy-2-propanol.

30. A cleaning solution of claim 29 additionally comprising a metal chelating effective amount of ethylenediaminetetraacetic acid.

31. A process for cleaning a microelectronics wafer substrate and maintaining wafer surface smoothness, said process comprising contacting the wafer substrate with a cleaning composition of claim 1 for a time and at a temperature sufficient to clean the wafer substrate.

32. A process for cleaning a microelectronics wafer substrate and maintaining wafer surface smoothness, said process comprising contacting the wafer substrate with a cleaning composition of claim 27 for a time and at a temperature sufficient to clean the wafer substrate.

33. A process for cleaning a microelectronics wafer substrate and maintaining wafer surface smoothness, said process comprising contacting the wafer substrate with a cleaning composition of claim 28 for a time and at a temperature sufficient to clean the wafer substrate.

34. A process for cleaning vias in a microelectronic wafer substrate, said process comprising contacting the vias in said substrate with a cleaning solution of claim 1 for a time and at a temperature sufficient to clean the vias.

35. A process for cleaning vias in a microelectronics wafer substrate, said process comprising contacting the wafer substrate with a cleaning composition of claim 29 for a time and at a temperature sufficient to clean the vias.

36. A process for cleaning vias in a microelectronics wafer substrate, said process comprising contacting the wafer substrate with a cleaning composition of claim 30 for a time and at a temperature sufficient to clean the vias.

37. An alkaline cleaning solution for microelectronics substrates comprising from about 0.1% to about 25% by weight of an aqueous metal ion free base selected from the group consisting of ammonium hydroxide, alkanolamines, quanidine, quaternary ammonium hydroxides and mixtures thereof, from about 0.01% to about 5% by weight of a nonionic surfactant selected from the group consisting of alkynol surfactants, fluorinated alkyl alkoxylates, fluorinated alkyl esterse, fluorinated polyoxyethylene alkanols, aliphatic acid esters of polyhydric alcohols, polyoxyethylene monoalkyl ethers, polyoxyethylene diols, siloxane surfactants and akylene glycol monoalkyl ethers and mixtures thereof and from about 0.1% to about 10% by weight of a pH reducing chemical buffering component to reduce and control the pH of the cleaning solution to a pH within the range of from about pH 8 to about pH 10 and wherein the chemical buffering component to reduce and control the pH of the cleaning solution is selected from the group consisting of inorganic mineral acids and their salts, ammonium hydroxide and its salts, acetic acid and its salts and mixtures thereof.

38. A process for cleaning a microelectronics wafer substrate and maintaining wafer surface smoothness, said process comprising contacting the wafer substrate with a cleaning composition of claim 37 for a time and at a temperature sufficient to clean the wafer substrate.

* * * * *

UNITED STATES PATENT AND TRADEMARK OFFICE
CERTIFICATE OF CORRECTION

PATENT NO. : 5,466,389
DATED : November 14, 1995
INVENTOR(S) : Joseph M. Ilardi, George Schwartzkopf and Gary G. Dailey It is certified that error appears in the above-identified patent and that said Letters Patent is hereby corrected as shown below:

Column 12,
Line 67, delete "0.1%" and insert therefor -- 0.01% --

Signed and Sealed this

Fifth Day of November, 2002

Attest:

JAMES E. ROGAN
Attesting Officer    Director of the United States Patent and Trademark Office